United States Patent [19]
Blomgren et al.

[11] Patent Number: 6,107,835
[45] Date of Patent: *Aug. 22, 2000

[54] METHOD AND APPARATUS FOR A LOGIC CIRCUIT WITH CONSTANT POWER CONSUMPTION

[75] Inventors: James S. Blomgren; Terence M. Potter; Stephen C. Horne; Michael R. Seningen; Anthony M. Petro, all of Austin, Tex.

[73] Assignee: Intrinsity, Inc., Austin, Tex.

[*] Notice: This patent is subject to a terminal disclaimer.

[21] Appl. No.: 09/209,207

[22] Filed: Dec. 10, 1998

Related U.S. Application Data

[60] Provisional application No. 60/069,250, Dec. 11, 1997.

[51] Int. Cl.$^7$ .................................................. H03K 19/096
[52] U.S. Cl. ................................ 326/98; 326/95; 326/93
[58] Field of Search .............................. 326/93, 95, 98, 326/105, 106, 108, 112, 119, 121

[56] References Cited

U.S. PATENT DOCUMENTS

| | | | |
|---|---|---|---|
| 4,176,287 | 11/1979 | Remedi | 326/108 |
| 4,684,829 | 8/1987 | Uratani | 326/106 |
| 4,851,714 | 7/1989 | Hwang | 326/98 |
| 5,387,827 | 2/1995 | Yokoyama et al. | 326/106 |
| 5,804,989 | 9/1998 | Sato | 326/108 |

*Primary Examiner*—Michael Tokar
*Assistant Examiner*—Daniel D. Chang
*Attorney, Agent, or Firm*—Booth & Wright, L.L.P.; Matthew J. Booth; Karen S. Wright

[57] ABSTRACT

The present invention comprises a method and apparatus for a logic circuit with constant power consumption. The logic circuit comprises a 1 of P first input signal that further comprises a plurality of wires wherein each wire of said plurality of wires has equal capacitive loading. The logic circuit additionally comprises a 1 of Q second input signal that comprises a plurality of wires wherein each wire of said plurality of wires has equal capacitive loading. A logic tree circuit couples to the first input signal and the second input signal. The logic tree circuit generates a result for a 1 of R output signal, which couples to the logic tree circuit. The 1 of R output signal comprises a plurality of wires wherein each wire of said plurality of wires has equal capacitive loading. The power consumption of the logic circuit is independent of the value of the first signal or the second signal, which results in the logic circuit having constant power consumption. Additionally, the logic circuit has a consistent current demand. The present invention provides that exactly one wire of the plurality of wires of the output signal is charged and discharged every clock cycle.

20 Claims, 5 Drawing Sheets

METHOD AND APPARATUS FOR A LOGIC CIRCUIT WITH CONSTANT POWER CONSUMPTION

This application claims the benefits of the earlier filed U.S. Provisional Application Ser. No. 60/069,250, filed Dec. 11, 1997, which is incorporated by reference for all purposes into this application.

BACKGROUND OF THE INVENTION

1. Field of the Invention

The present invention relates to the field of digital electronics, and more particularly to power consumption of electronic logic devices.

2. Description of the Related Art

Complementary metal oxide semiconductors ("CMOS") have become the dominant integrated circuit technology, largely due to the low power consumption of circuits using such technology. In particular, digital CMOS logic gates have become the building blocks of virtually all of the modem information-related technologies, long-ago overcoming earlier technologies such as NMOS circuits, bipolar circuits, and BiCMOS circuits.

Various CMOS logic families have become well-known to the logic designer. For example, the static CMOS family has become widely used. Static CMOS devices have included both NMOS transistors and PMOS transistors, generally in equal numbers, on a common substrate. Each NMOS transistor has been paired with a PMOS transistor with both transistors in the pair being gated by a common input signal. Each transistor gates its drain terminal to its source terminal voltage when the input signal has a one voltage, and disconnects its drain terminal from its source terminal voltage when the input signal has a different voltage.

Static CMOS technology has had an important power advantage due to the low power consumption of such gates. However, the need to fabricate both NMOS transistors and PMOS transistors has become problematic as devices have become smaller and more densely organized.

To address the need for faster, denser circuits, dynamic CMOS logic technology has emerged. Dynamic logic families such as precharge dynamic logic, differential cascade voltage switch logic, domino logic, complementary pass transistor logic, multiple-output domino logic ("MODL"), latched domino logic, NORA logic, zipper CMOS logic and other dynamic logic families have reduced the number of transistors needed to implement a circuit. Such dynamic logic families have included internal nodes that are precharged to one logic level during one portion (the "precharge" portion) of a clock cycle, and then are selectably discharged during another portion (the "evaluate" portion) of the clock cycle. The discharging is only performed if the input value has a particular value during the evaluate portion.

Although these CMOS logic families differ from one another in many respects, one characteristic that all share is a high capacitance. In all of these CMOS logic families, the inputs to the logic gates are provided to the gate terminals of PMOS transistors or NMOS transistors. Both PMOS transistors and NMOS transistors have relatively high gate-to-substrate capacitances, realized across the oxide layer between the gate terminal and the substrate. The capacitance of such transistors tends to store or consume power.

The gate-to-substrate capacitances within the transistors are only one source of parasitic capacitance within a CMOS logic circuit. The interconnects among the gates generally have greater capacitance than the logic gates themselves. This greater capacitance has largely been caused by the diminution of transistor size. As transistors have become smaller, the interconnects among the logic gates have become the dominant load capacitance for the logic gates. The logic gates themselves, while being extremely small, typically have 1.5 fF/$\mu$m of capacitance per gate width. In contrast, the wires have approximately 0.24 fF/$\mu$m of wire length, but they may be 1000 $\mu$m long, or longer. It is common for the interconnect capacitance to account for 80% or more of the total load capacitance of a logic gate.

It is well known in the electronics industry that the power consumed in charging and discharging a capacitor is equal to the product of the switching frequency, the capacitance, and the square of the voltage being driven onto the capacitor. Although logic gates fabricated of CMOS technologies generally consume far less power than logic gates fabricated of bipolar technologies, as CMOS gates are driven with higher frequency input signals, the power consumed by such logic gates generally increases. At very high frequencies, the low-power advantages of such logic gates all but disappears, and power consumption is quite high. In fact, at very high frequencies, the power consumption of static CMOS logic gates can exceed even that of bipolar junction transistors.

Moreover in a circuit including only static CMOS logic gates, some gates may be left in a particular logic state from one clock cycle to the next. The logic gates that remain in one logic state from one clock cycle to the next consume practically no power, while other logic gates that switch from one state to another consume significant power. Groups of logic gates involved in a particular operation demand greater power of a power supply, while other groups of logic gates that are not involved in a particular operation demand practically no power. When coupled with the potentially high power consumption caused by the parasitic capacitances of wires interconnecting the more active gates, the resulting power imbalance places a heavy burden on power supplies to meet the demands of various portions of a circuit at different times. In addition, overall circuit complexity makes power consumption of the circuit at any particular point in time difficult to calculate. As circuits have become more complex, it has become increasingly unlikely that the logic gates, or portions of logic gates, that may be selected according to the input signal have the same input capacitance. In other words, it has become increasingly unlikely that the output capacitance of the logic gate performing the selection can be independent of the selection itself.

Finally, driving circuits at higher frequencies has created supply impedance problems. The supply loop has a certain inductance, which tends to maintain a relatively constant current in the circuit loop although it impedes altering the amount of current in the circuit loop. Inductance makes abrupt changes in current very difficult, which can cause supply voltage fluctuation. Moreover, the current demand and the change in current, are highly dependant on the nature of the operations being performed. Consequently, compensating for such inductance by designing in on-chip capacitance is very difficult.

The present invention addresses these difficulties with particular applicability to the N-nary logic family. The N-nary logic family supports a variety of signal encodings, including 1-of-4, and is more fully described in the co-pending application, U.S. patent application Ser. No. 09/019,278, filed Feb. 5, 1998, and entitled "Method and Apparatus for Reducing an Integrated Circuit's Power Consumption and Wire to Wire Capacitance Using 1 of N Signals" (hereinafter "N-nary Patent"), which is incorporated by reference into this application. In 1-of-4 encoding, four wires are used to indicate one of four possible values. In contrast, traditional static logic design uses two wires to indicate four values. "Traditional" dual-rail dynamic logic also uses four wires to represent two bits, but the dual-rail scheme always requires two wires to be asserted. In contrast, N-nary logic only requires assertion of one wire. The benefits of N-nary logic over dual-rail dynamic logic, such as reduced power and reduced noise, should be apparent from a reading of The N-nary patent.

All signals in N-nary logic, including 1-of-4, are of the 1-of-N form where N is any integer greater than one. A 1-of-4 signal requires four wires to encode four values (0–3 inclusive), or the equivalent of two bits of information. More than one wire will never be asserted for a 1-of-N signal. Similarly, N-nary logic requires that a high voltage be asserted for all values, even 0.

Any one N-nary gate may comprise multiple inputs and/or outputs. In such a case, a variety of different N-nary encodings may be employed. For instance, consider a gate that comprises two inputs and two outputs, where the inputs are a 1-of-4 signal and a 1-of-2 signal and the outputs comprise a 1-of-4 signal and a 1-of-3 signal. Various variables, including P, Q, R, and S, may be used to describe the encoding for these inputs and outputs. One may say that one input comprises 1-of-P encoding and the other comprises 1-of-Q encoding, wherein P equals two and Q equals four. Similarly, the variables R and S may be used to describe the outputs. One might say that one output comprises 1-of-R encoding and the other output comprises 1-of-S encoding, wherein R equals four and S equals 3. Through the use of these, and other, additional variables, it is possible to describe multiple N-nary signals that comprise a variety of different encodings.

SUMMARY

The present invention comprises a method and apparatus for a logic circuit with constant power consumption. The logic circuit comprises a 1 of P first input signal that further comprises a plurality of wires wherein each wire of said plurality of wires has substantially the same capacitive loading. The logic circuit additionally comprises a 1 of Q second input signal that comprises a plurality of wires wherein each wire of said plurality of wires has substantially the same capacitive loading. A logic tree circuit couples to the first input signal and the second input signal. The logic tree circuit generates a result for a 1 of R output signal, which couples to the logic tree circuit. The 1 of R output signal comprises a plurality of wires wherein each wire of said plurality of wires has substantially the same capacitive loading. The power consumption of the logic circuit is independent of the value of the first signal or the second signal, which results in the logic circuit having substantially constant power consumption. Additionally, the logic circuit has a substantially consistent current demand. The present invention provides that exactly one wire of the plurality of wires of the output signal is charged and discharged every clock cycle. The preferred embodiment of the present invention provides P, Q, and R each being equal to 4; i.e., the 1 of P signal, the 1 of Q signal, and the 1 of R signal are all 1 of 4 signals. Other embodiments of the present invention provide for P, Q, and R each being greater than 2.

BRIEF DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention comprises a method and apparatus for a logic circuit with constant power consumption. This disclosure describes numerous specific details that include specific structures, circuits, and logic functions in order to provide a thorough understanding of the present invention. One skilled in the art will appreciate that one may practice the present invention without these specific details. Additionally, this disclosure does not describe in detail some well-known structures such as N-FETs, P-FETs, nor does it describe N-nary logic in detail, in order not to obscure the present invention.

The present invention relates to a logic gate configured to receive a clock signal and at least one input logic signal, and further configured to provide at least one output logic signal switchable between a first input logic state and a second input logic state in response to the input logic signal. The logic gate comprises a first output wire of the output logic signal, configured to provide a time-varying voltage and to consume a first amount of power when the input logic signal is in the first input logic state, and a substantially constant voltage when the input logic signal is in the second input logic state. The logic gate also comprises a second output wire of the output logic signal, configured to provide a substantially constant voltage when the input logic signal is in the first input logic state, and a time-varying voltage and to consume a second amount of power when the input logic signal is in the second input logic state, the second amount of power being substantially equal to the first amount of power.

Figure 1:
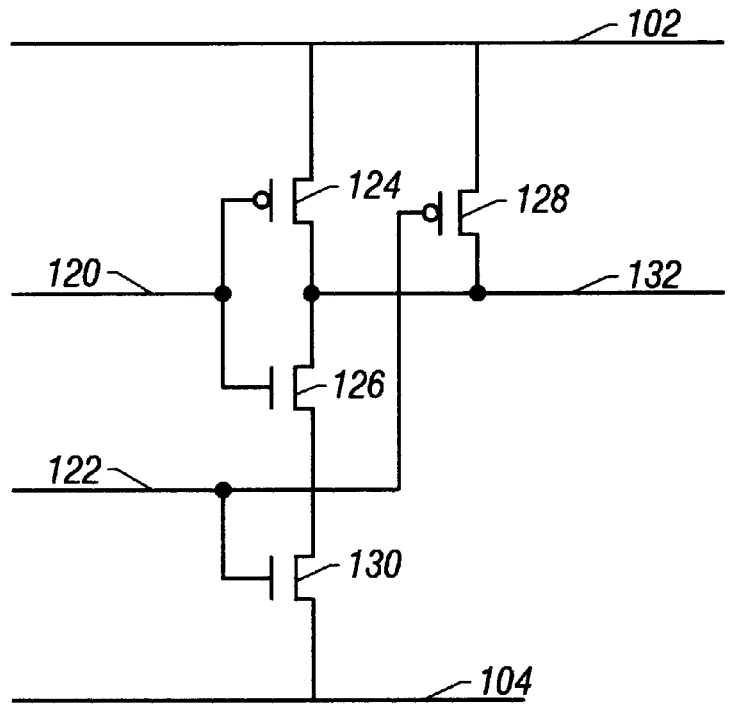
FIG. 1 shows a static CMOS logic gate.

Referring now to FIG. 1, a static CMOS logic device is shown. The static CMOS logic device of FIG. 1 is coupled to a power rail 102 providing a positive rail voltage, such as 3.3 volts or 5 volts. The static CMOS logic device is also coupled to a ground rail 104 providing a ground voltage, taken as zero volts. The static CMOS logic device receives binary two input signals 120 and 122, and provides each of the input signals to a CMOS pair of transistors. Input signal 120 is provided to the gate terminal of PMOS transistor 124 and to the gate terminal of NMOS transistor 126. Input signal 122 is provided to the gate terminal of PMOS transistor 128 and to the gate terminal of NMOS transistor 130.

NMOS transistors 126 and 130 are configured in series between an output node 132 and the ground rail 104, while PMOS transistors 124 and 128 are configured in parallel between an output node 132 and the power rail 102. NMOS transistors 126 and 130 may be considered an "N-tree" providing selectable pull-down of the output node 132, and PMOS transistors 124 and 128 may be considered a "P-tree" providing selectable pull-up of the output node 132.

The operation of the static CMOS NAND-gate is well known. When both input signals have a voltage exceeding the threshold voltage of the NMOS transistor that they gate, the NMOS transistors 126 and 130 provide a conductive path between the output node and the ground rail 104. Concurrently, both PMOS transistors 124 and 128 "begin to" cut off, eventually open-circuiting paths to the power rail 102. The output voltage is driven to the ground voltage. On the other hand, when either input signal has a voltage that is less than the threshold voltages of the NMOS transistor and PMOS transistor that it gates, the NMOS transistor cuts off, open-circuiting paths to the ground rail 104, while the PMOS transistor provides a conductive path between the output node and the power rail 102. The output voltage is driven to the power voltage.

Circuits fabricated with static CMOS technology and operated at high frequencies display all of the capacitance, inductance, and power consumption problems discussed above.

Figure 2:
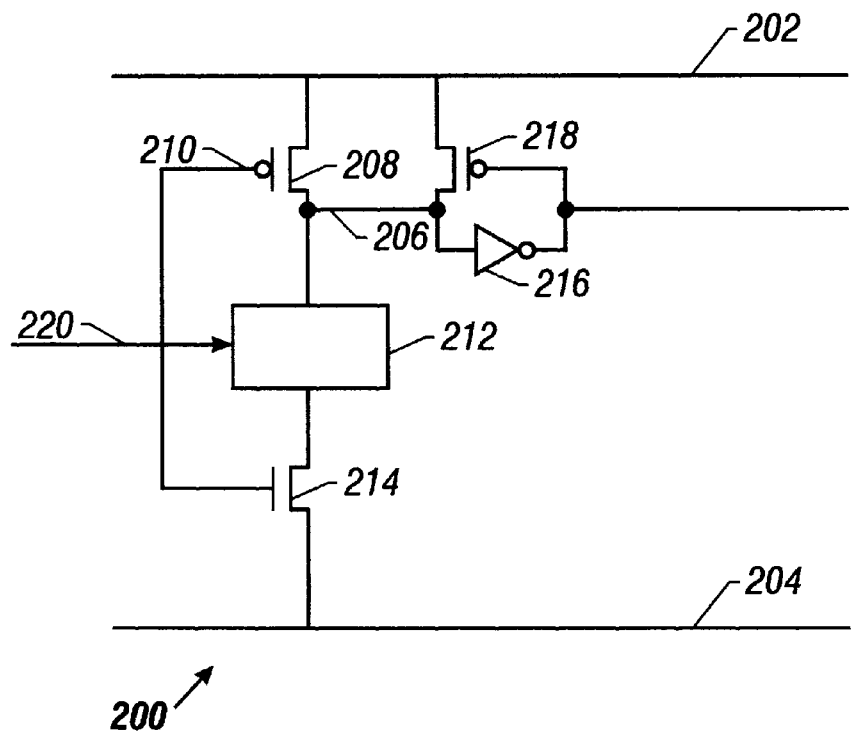
FIG. 2 shows a logic gate according to the precharge dynamic logic family.

Referring now to FIG. 2, a precharge dynamic logic gate is shown. The precharge dynamic logic gate is coupled to a power rail 202 providing a positive rail voltage, such as 3.3 volts or 5 volts. The precharge dynamic logic gate is also coupled to a ground rail 204 providing a ground voltage, taken as zero volts. A single internal evaluate node 206 is coupled across a single PMOS transistor 208 to the power rail 202. The PMOS transistor 208 receives a clock signal 210. An N-tree 212 is coupled between the internal evaluate node 206 and an NMOS transistor 214. The N-tree 212 receives the input signal or input signals 220; the NMOS transistor 214 receives the same clock signal as the PMOS transistor 208.

The internal evaluate node 206 is provided to a "keeper" element that includes an inverter 216 and a PMOS transistor 218. The logic state of the internal evaluate node 206 is inverted by inverter 216, which provides an output signal from the logic gate 200. The output voltage is provided to the gate terminal of PMOS transistor 218, which provides sufficient current to restore and refresh the voltage on the internal evaluate node.

Since the PMOS transistor 208 and the NMOS transistor 214 receive the same clock signal and are of complementary conduction dopings, each conducts during a different portion of the clock cycle. When the clock signal has a low voltage, less than the threshold voltage of the PMOS transistor 208, the PMOS transistor 208 conducts and the internal evaluate node is precharged to a high logic state. Also, the NMOS transistor 214 is cut off, and N-tree 212 is disabled. The rising voltage of the clock signal eventually cuts off the PMOS transistor 208.

When the clock signal has a high voltage (greater than the threshold voltage of the NMOS transistor 214), the N-tree 212 is enabled. The enabling of the N-tree 212 allows various logic within the N-tree 212 to select, according to the input signal, whether to discharge the accumulated voltage from the internal evaluate node, across the N-tree 212 and NMOS transistor 214. Still later in the clock cycle (but before the internal evaluate node can again be precharged), the voltage on the internal evaluate node is "kept" or latched by the keeper transistor 218. And lastly, output driver transistor 216 helps drive the signal to a subsequent logic gate.

The capacitance of the output wire is large in comparison to the capacitance of any node in the logic gate. Unfortunately, however, the power consumed by the precharge dynamic logic gate cannot be readily determined from the physical characteristics and parameters of the logic gate itself. The reason that the power consumption cannot be readily determined is the uncertainty regarding the input signal.

During a first portion of every clock cycle, the internal evaluate node is either precharged or refreshed to a high voltage. Due to the relatively small capacitance of the internal evaluate node, though, the precharging of the internal evaluate node consumes only a small amount of power if the internal evaluate node has been discharged during the previous clock cycle, and an even smaller amount of power if the internal evaluate node has not been discharged during the previous clock cycle. The inverter 216 responds to the high voltage on the internal evaluate node by driving the output wire 220 to a grounded voltage.

During a second portion of every clock cycle, the N-tree 214 is enabled. Enabling the N-tree 212 allows the N-tree 212 to respond to the input signal or input signals. If the input signal has a low voltage, then the N-tree 212 does not discharge the internal evaluate node, which remains at its precharged voltage. On the other hand, if the input signal has a high voltage, then the N-tree 212 does discharge the internal evaluate node; the residual electrostatic charge on the internal evaluate node drains through the N-tree 212 and the NMOS transistor 214.

In the former situation, in which the internal evaluate node remains at a precharged (high) logic state, the output wire is maintained at a low voltage by the inverter 216. Maintaining a wire at a zero-voltage logic state, from one clock cycle to the next, does not consume any significant power. However, in the latter situation, in which the internal evaluate node is discharged through the N-tree 212 and the NMOS transistor 214, a positive voltage is applied to the output wire by the inverter 216. In other words, in the latter situation, the output node is brought to a high voltage, after having been brought to a low (ground) voltage during the first portion of the clock cycle.

The power consumption of the precharge dynamic logic gate is therefore extremely dependent on the state of the input signal. The precharge dynamic logic gate consumes far more power when the input signal is high than when the input signal is low. When the input signal is low, the output wire is maintained at a constant voltage (approximately ground voltage) every clock cycle. Consequently, virtually no power is consumed. However, when the input signal is high, the output wire is charged and discharged every clock cycle. Consequently, the resulting power consumption is quite large.

Since the power consumed in charging and discharging a capacitor is equal to the product of the frequency, the capacitance, and the square of the voltage, the product of the frequency and the square of the voltage may be regarded as an amplification factor, scaling the capacitance. As the frequency increases, therefore, the increasing frequency multiplies the effect of the capacitance.

The fluctuations in power consumption are fluctuations in current demand. When the input signal is high, the output wire is charged and discharged every clock cycle. To charge the output wire during the first portion of every clock cycle the precharge dynamic logic gate draws substantial current from the power rail 202 through the inverter 216 and PMOS transistor 218. To discharge the output wire during the second portion of every clock cycle the precharge dynamic logic gate sinks substantial current from the power rail 202 through the inverter 216 and N-tree 212. However, when the input signal is low, the output wire is neither charged nor discharged, and remains in its previous state; consequently, practically no current is used.

These disadvantages are addressed by the present invention, with particular applicability to the N-nary logic family. The present invention includes a logic gate according to a new dynamic CMOS logic family, known as the N-nary logic family. The N-nary logic family is described in more detail in the copending "N-nary patent."

Figure 3:
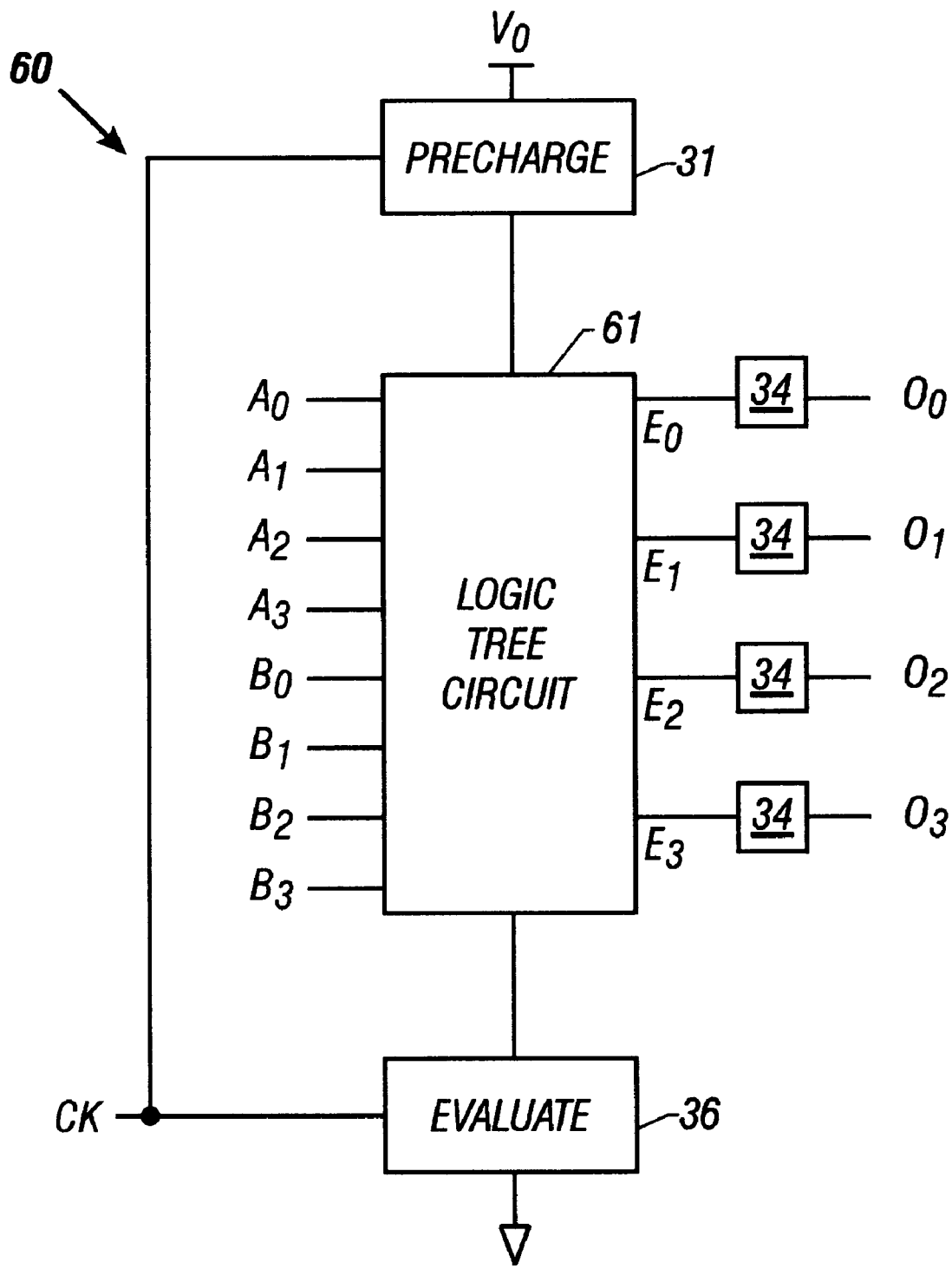
FIG. 3 is a block diagram of an N-nary gate.

N-nary logic may be used to create circuits to perform a desired function such as an AND/NAND gate or an adder. A background discussion of N-nary circuits is in order to understand the present invention. FIG. 3 illustrates a 1-of-N logic gate 60 that uses two sets of 1-of-N signals for the inputs and produces one 1-of-N signal for the output. In gate 60, the A and B inputs comprise four wires each, with each set of wires representing 2 bits (one dit) of data. A is a one-dit input, B is a one-dit input, and O is a one-dit output. In other words, the gate 60 depicted in FIG. 1 comprises 4 input bits (2 dits) and 2 output bits (one dit).

Figure 4:
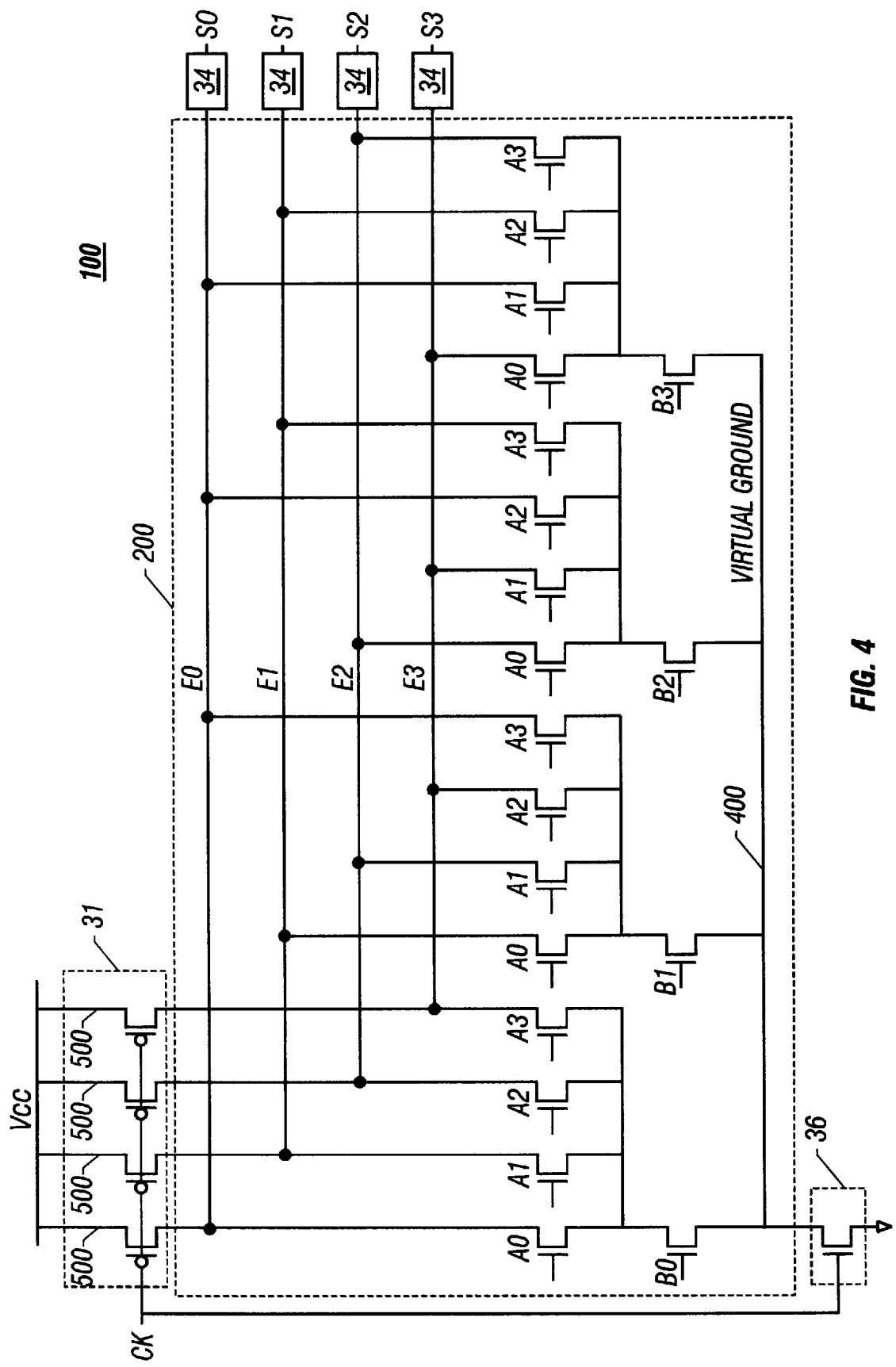
FIG. 4 is an illustration of an N-nary adder gate.

Each N-nary dit logic circuit 60 comprises a logic tree circuit 61, a precharge circuit 31, and an evaluate circuit 36. The logic tree circuit 61 performs a logic function on the two 1-of-4 input signals that could comprise a variety of functions, for example, the Boolean logic functions AND/NAND and OR/NOR, or a more complex add/subtract/carry-propagate. The logic gates of the N-nary family are clocked pre-charge (CP) gates. FIG. 4 illustrates that each input into the logic tree circuit 61 $A_0-A-_3$, $B_0-B_3$ is coupled to at least one N-channel field effect transistor (NFET) $A_0-A_3$, $B_0-B_3$. Referring back to FIG. 3, the logic tree circuit 61 therefore comprises one or more N-channel FETS. Coupled to the wires of the 1-of-4 output signal are the output buffers 34 that aid in driving additional circuits that couple to the output signal. The preferred embodiment of the present invention uses a circuit with an inverting function as the output buffer 34.

Referring again to FIG. 3, a precharge circuit 31 couples to the logic tree circuit 61 and precharges the dynamic logic of the logic tree circuit 61. The precharge circuit 31 comprises one or more FETs with the preferred embodiment of the circuit comprising P-channel FETs (PFETs). Each evaluation path of the logic tree circuit 61 has its own precharge PFET, shown as 500 in FIG. 4. The PFETs 500 of the precharge circuit 31 quickly and fully precharge all of the dynamic logic in the logic tree circuit 61 during the precharge phase of the clock cycle.

FIG. 4 is a diagram of an N-nary adder gate 100. FIG. 4 illustrates that the precharge PFET 500 for an internal evaluation node E of an N-nary circuit is connected to positive high voltage, Vcc, and is used to create conductive paths between the evaluation node E and Vcc. Each precharge PFET 500 is coupled to an input, the pre-charge signal. When the pre-charge signal for any internal evaluate node has a low voltage, then there is a conductive path between Vcc and the evaluation node E. Coupled to the precharge circuit 31 is the clock signal CK. A low clock signal on CK will cause the FETs in the logic tree circuit 32 to charge when using P-channel FETs in the precharge circuit 31.

An evaluate circuit 36 couples to the logic tree circuit 61 (which in FIG. 4 is the adder logic tree circuit 200) and controls the evaluation of the logic tree circuit 61. The evaluate circuit 36 comprises one or more FETs connected to the CK signal, with the preferred embodiment of the evaluate circuit comprising a single N-channel FET. The single N-FET acts as an evaluation transistor that is used to control when the gate is sensitive to inputs, helps avoid races between other devices, and prevents excessive power consumption. During the precharge phase, the evaluate circuit 36 receives a low value so that no path to Vss may exist through the NFET(s) of the logic tree circuit 61. During the evaluate phase, the evaluate circuit 36 receives a high signal so that a path to Vss through the NFET(s) of the logic tree circuit 61 may exist. Coupled to the evaluate circuit 36 is the clock signal CK. A high clock signal on CK will cause the FETs in the logic tree circuit 61 to evaluate when using N-channel FETs in the evaluate circuit 36. In other words, when the clock signal is high, the evaluate circuit 36 evaluates the logic tree circuit 61.

An internal evaluate node, E, which comprises the four wires $E_0$, $E_1$, $E_2$, and $E_3$, is the signal pathway between the logic tree circuit 61 and an output buffer 34, and constitutes an evaluation path of the logic tree circuit 61. As stated earlier, each internal evaluation node wire $E_0$, $E_1$, $E_2$, and $E_3$ has its own precharge PFET. The signal on a particular wire, $E_0$, $E_1$, $E_2$, $E_3$ of the internal evaluate node E is high only when there is no connection to Vss through the logic tree circuit 61 NFET(s) associated with that particular wire. If the pre-charge signal is low at time 0 and there is no path to ground through the NFET(s) associated with an internal evaluate node E of the logic tree circuit 61, then the internal evaluate node wire E gets pulled to a high voltage. This is called the precharge phase of the gate and we may also say that the gate is in precharge mode. If the precharge signal switches to a high voltage at a later time, the internal evaluate node E will be floating, but the charge left on it will leave the voltage high. This is called the evaluate phase of the gate, and we may also say that the gate is in evaluate mode. If input signals generate a high voltage for any NFET(s) in the logic tree circuit 61 such that a path from the internal evaluate node E to ground (Vss) exists, then the charge on the internal evaluate node E will drain to ground, and the evaluate voltage will drop to Vss. If no such path exists, then the internal evaluate node E will remain at Vcc. When any gate, therefore, switches from precharge mode to evaluate mode, the internal evaluate node voltage is high, and it either stays high or goes low. Once the internal evaluate node voltage goes low during the evaluate phase, it cannot be driven high again until the next precharge phase.

Figure 5:
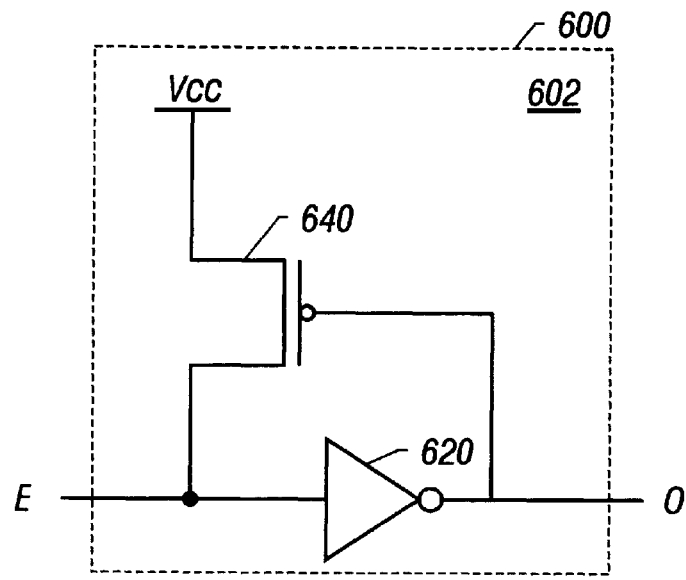
FIG. 5 is a diagram of a first embodiment of an N-nary output driver circuit.
Figure 6:
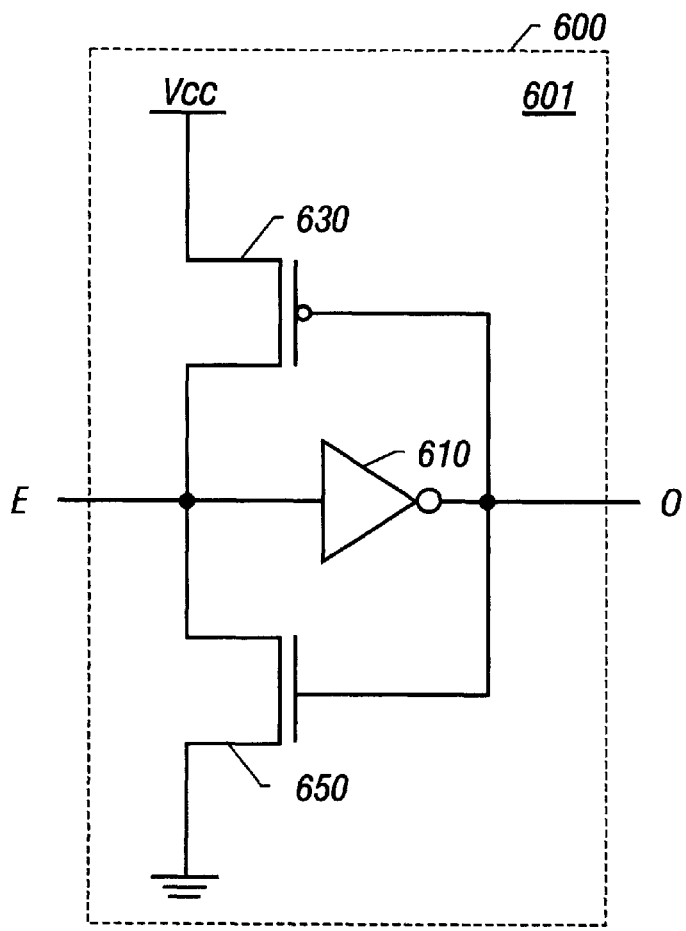
FIG. 6 is a diagram of a second embodiment of an N-nary output driver circuit.

Each internal evaluate node wire $E_0$, $E_1$, $E_2$, and $E_3$ couples to an output buffer 34. Two embodiments of the output driver circuit 600 comprising the output buffer 34 are illustrated in FIGS. 5 and 6. FIG. 5 illustrates a half keeper output driver circuit 602 that comprises an inverter 620 and a PFET device 640. FIG. 6 illustrates a full keeper output driver circuit 601 that comprises an inverter 610 coupled to a PFET device 630 and an NFET device 650. Full keeper circuits 601 are necessary for gates that can be in neither evaluate nor precharge mode for lengthy periods. The flow through the output driver circuit 600 is from internal evaluate node E to the output signal path O. The inverter 610, 620 of the output driver circuit 600 is necessary because the internal evaluate nodes of CP gates of the N-nary logic family precharge to a high value and evaluate to a low value. The output driver circuit 600 of the output buffer 34 holds the value of an internal evaluate node E during an evaluate phase if the internal evaluate node E has not discharged. If the internal evaluate node E has discharged, then there is a path to ground holding its value low. The output of each internal evaluate node E will switch from low to high once, at most, during an evaluate phase. The output of each internal evaluate node E, once coupled to an output driver circuit 600 of an output buffer 34, is therefore suitable for feeding a subsequent CP gate.

In summarizing N-nary logic gates within the N-nary logic family include an N-tree having a number of NMOS transistors arranged in stacks. Like precharge dynamic logic gates, the N-nary logic gates also have an internal evaluate node that is precharged to one logic state during one portion of a clock cycle, and then may be discharged during a subsequent portion of the clock cycle. Like the evaluate node of a precharge dynamic logic gate, the internal evaluate node of a N-nary logic gate is precharged during every clock cycle; also, whether the internal evaluate node is discharged during the subsequent portion of the clock cycle depends upon the value of an input signal. However, unlike precharge dynamic logic gates, each N-nary logic gate includes several internal evaluate nodes coupled to a common N-tree. Also, the transistors in an N-nary logic gate are configured to select one of the internal evaluate nodes and to deselect all the other internal evaluate nodes in the N-nary logic gate for every combination of input values.

The N-nary logic family has an advantage over traditional dual-rail dynamic logic in that the ability to encode values in 1-of-N format (and in preferred embodiments with N>2) allows more efficient (i.e., faster and lower power) implementations while retaining the constant power characteristics.

Other significant differences between precharge dynamic logic and N-nary logic are relevant to the present invention. For example, rather than providing an output signal on a single wire as in precharge dynamic logic, an N-nary logic gate provides an output signal on several wires. Each of the output wires is coupled to a distinct internal evaluate node within the N-nary logic gate. Selecting an internal evaluate node in turn selects one of the wires belonging to the output signal.

Figure 7:
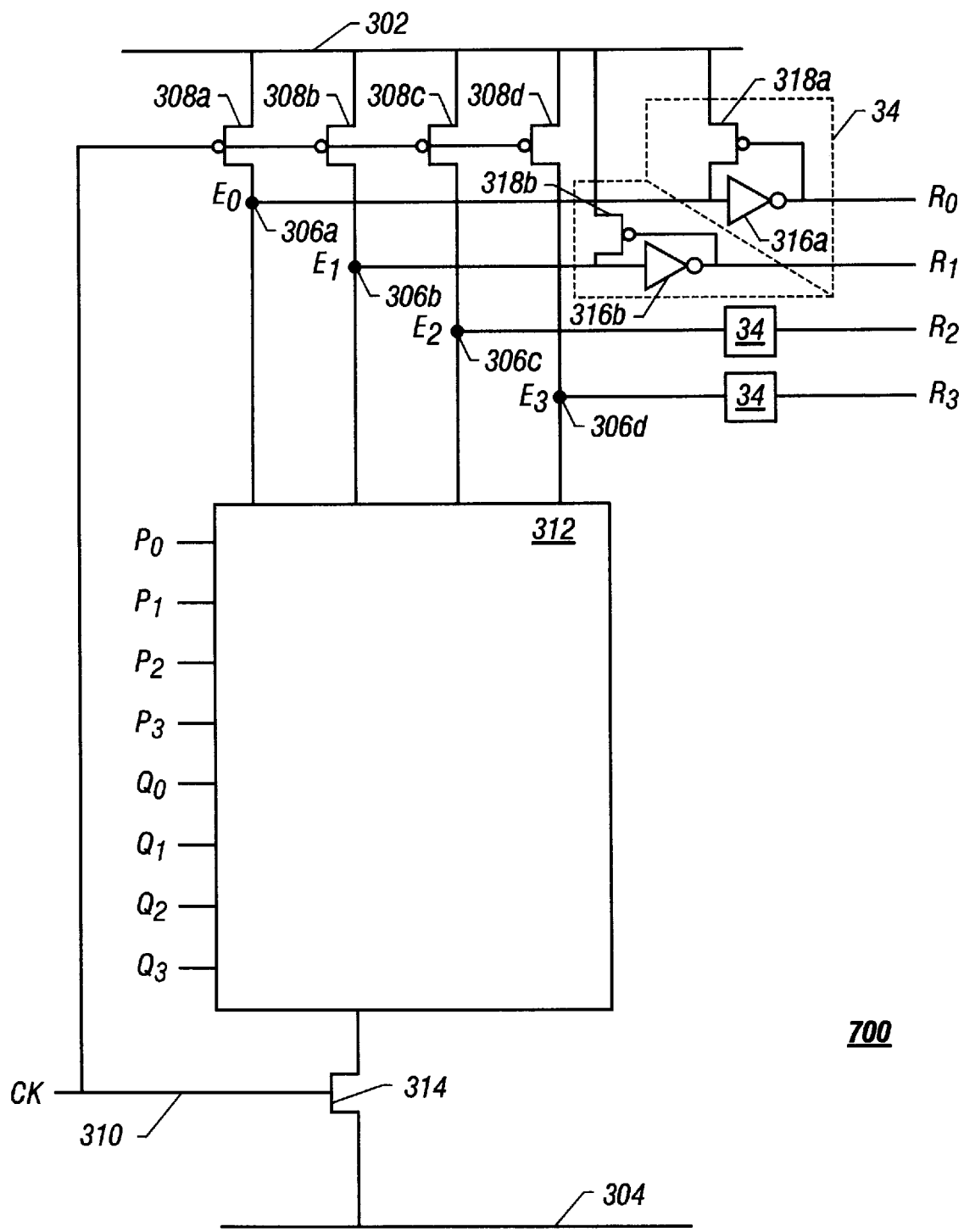
FIG. 7 shows an N-nary logic gate according to one embodiment of the present invention.

FIG. 7 illustrates one embodiment of the present invention that comprises an N-nary logic gate 700. The logic gate 700 comprises a logic tree circuit or N-Tree circuit 312, which comprises a plurality of transistors that perform a logic function in response to a set of input signals. Coupled to the logic tree circuit are the two input signals P and Q where P comprises a 1 of 4 signal and Q comprises a 1 of 4 signal. The 1 of 4 signal P further comprises a set of wires, $P_0$, $P_1$, $P_2$, and $P_3$, while the 1 of 4 signal Q further comprises a set of wires, $Q_0$, $Q_1$, $Q_2$, and $Q_3$. Coupled to the logic tree circuit 312 is the output signal R that comprises a 1 of 4 signal, which includes a set of wires $R_0$, $R_1$, $R_2$, and $R_3$. As does the N-nary logic gate 60 illustrated in FIG. 3, the logic gate 700 of FIG. 7 comprises a precharge device and an evaluate device. The precharge device in FIG. 7 is shown as the plurality of transistors 308a, 308b, 308c, and 308d. These devices couple to a power rail 302 that is some voltage, for example 3.3 or 5 volts. The evaluate device is shown as transistor 314, which couples to ground rail 304. The ground rail 304 is typically at zero volts. The precharge devices couple to the logic tree circuit 312 at the internal evaluate nodes $E_0$, $E_1$, $E_2$, and $E_3$. The output signal R couples to the internal evaluate nodes through the output buffer devices 34. As illustrated in this figure, the output buffer device for wire $R_0$ further comprises inverter 316a and transistor 318a, while the output buffer device for wire $R_1$ further comprises inverter 316b and transistor 318b. And finally, the clock signal 310 couples to the evaluate device 314 and the precharge devices 308a, 308b, 308c, and 308d.

The following discussion regarding the charging of the interal evaluate nodes by their respective precharge devices and the additional interaction with the inverters and transistors of the output devices for the internal evaluate nodes E0 and E1 also apply to the internal evaluate nodes E2 and E3. For brevity, our discussion focuses on the internal evaluate nodes E0 and E1.

Since the PMOS transistors 308a and 308b and NMOS transistor 314 receive the same clock signal and are of complementary conduction dopings, the PMOS transistors 308a and 308b conduct during one portion of the clock cycle and the NMOS transistor 314 conducts during a different portion of the clock cycle. When the clock signal has a low voltage, the PMOS transistors 308a and 308b conduct and the internal evaluate nodes are precharged to a high logic state. Also, the NMOS transistor 314 is cut off, and N-tree 312 is disabled. When the clock signal has a high voltage, PMOS transistors 308a and 308b are cut off and cause the voltage of the internal evaluate node to float capacitively or to be pulled low by the N-tree.

During a first portion of every clock cycle, the clock signal has a low voltage. The low voltage on the clock signal causes PMOS transistors 308a and 308b to conduct, either precharging or refreshing the internal evaluate nodes to a high voltage. For reasons that are explained below, and that relate to the "N-nariness" of the logic gate, the first portion of clock cycle occurs when exactly one of the internal evaluate nodes in a gate has been at a low voltage, and all of the remaining internal evaluate nodes of the gate are at a high voltage. Consequently, during the first portion of the clock cycle, exactly one internal evaluate node is precharged from a low voltage to a high voltage, and all of the remaining internal evaluate nodes are refreshed at a high voltage during the first portion of the clock cycle.

Due to the relatively small capacitance of the various internal evaluate nodes, though, the precharging of the internal evaluate node consumes only a small amount of power, despite the relatively large change in voltage. The refreshing of the other internal evaluate nodes consumes an even smaller amount of power.

During the first portion of the clock cycle, the voltage on the output wires is also changed accordingly. The inverters 316a and 316b and PMOS transistors 318a and 318b are each coupled between an internal evaluate node and a corresponding output wire. Consequently, immediately before the first portion of the clock cycle (when exactly one of the internal evaluate nodes has been at a low voltage and all of the remaining internal evaluate nodes are at a high voltage), it will be recognized that exactly one output wire has been at a high voltage and all of the remaining internal evaluate nodes are at a low voltage.

During the first portion of the clock cycle, when exactly one internal evaluate node is precharged from a low voltage to the high voltage already established on the remaining internal evaluate nodes, the corresponding output wire is discharged through the appropriate inverter of the output buffer devices that couple to the precharged internal evaluate node. The corresponding output wire is discharged to the low voltage already established on the remaining output wires. All of the remaining output wires are maintained at a low voltage by the inverters of the output buffer devices coupled thereto, as all of the remaining internal evaluate nodes are refreshed at a high voltage during the first portion of the clock cycle.

The second portion of the clock cycle occurs when all of the internal evaluate nodes have been either precharged or refreshed at a high voltage, and when all of the output wires have been discharged or maintained at a low voltage. The second portion of the clock cycle begins after a high voltage is provided on the clock signal. The high voltage on the clock signal causes the NMOS transistor 314 to conduct, coupling the N-tree 312 to the ground rail 304.

The N-tree 312 is implemented according to an N-nary logic style. Accordingly, regardless of the input signal and regardless of the number of internal evaluate nodes, during the second portion of the clock cycle the N-tree selects exactly one internal evaluate node for each output signal of the N-nary logic gate. The selected internal evaluate node is driven to the ground voltage across NMOS transistors within the N-tree 312 and across the NMOS transistor 314. The selection of exactly one internal evaluate node regardless of the value of the input signal is an inherent feature of the N-nary logic style, and serves as the reason that the first portion of clock cycle occurs when exactly one of the internal evaluate nodes has been at a low voltage, and all of the remaining internal evaluate nodes are at a high voltage.

The value of the input signal defines the selection of the internal evaluate node, depending upon the internal internal structure of the N-tree 312. Regardless of which internal evaluate node is selected, however, at the beginning of the second portion of each clock cycle, all internal evaluate nodes are always at a high voltage, and during the second portion of each clock cycle exactly one internal evaluate node discharges. Moreover, with respect to the output wires at the beginning of the second portion of each clock cycle, all of the output wires will initially be at a low voltage, and during the second portion of each clock cycle exactly one output wire of each output signal will be charged to a high voltage.

When a particular internal evaluate node within an N-nary logic gate drives a capacitive load having a large capacitance, the power consumed is greater than when another internal evaluate node within the N-nary logic gate drives a different capacitive load having a smaller capacitance. The selection of the internal evaluate node depends on the values of the input signal and changes during every clock cycle. Consequently, when the various internal evaluate nodes drive different capacitive loads, the amount of power consumed per clock cycle depends on the value of the input signal during that cycle.

Additionally, since the power consumed in charging and discharging a capacitor is equal to the product of the frequency, the capacitance, and the square of the voltage, as the frequency increases, the effect of the capacitance is multiplied.

Disparate capacitive loading can result from several sources. In some circuits, an N-nary logic gate drives an N-nary signal to a subsequent N-nary logic gate that has different loading for each wire of the N-nary signal. Other situations in which disparate capacitive loading might arise include circuits in which one wire of an N-nary signal may be used to drive a signal off-chip, or is longer than another signal wire, or drives an interconnect to many points on the chip. Making the transistors within the inverters 316a and 316b wider for example, to provide larger currents to such heavily-loaded interconnects, merely pushes the problem back to the previous logic gate, which must then drive greater currents on wires that lead to the wider inverter transistors.

According to one embodiment of the present invention, the output wires belonging to an N-nary logic signal (generated by an N-nary logic gate) are fabricated to implement substantially identical (or equal) capacitances. The capacitance of any output wire from an N-nary logic gate are therefore substantially identical to the capacitance of any other wire belonging to the same N-nary logic signal. Moreover, with respect to N-nary logic circuits, the substantial equality of capacitance among the wires of an N-nary signal continues throughout the interconnect layers.

The consequence of implementing such a design is to effectively eliminate any dependence of power consumption on the value of the input signal. The present invention provides equal capacitive loading on each wire belonging to an N-nary output signal generated by an N-nary logic gate.

As the power consumed by each N-nary logic gate within a circuit is made independent of the value of the input signals, the power consumption of the circuit becomes independent of the type of operation being performed by the circuit. The overall circuit power consumption becomes more predictable, regardless of the application to which the circuit is applied. Therefore, the present invention comprises a logic circuit having substantially constant power consumption. The value of predictable power consumption has often been overlooked by engineers concerned more with average power consumption or peak power consumption.

Constancy in power consumption is accompanied by constancy in current demand. Regardless of the input, exactly one output wire (of an output signal) is charged and discharged every clock cycle. To charge the output wire during the first portion of every clock cycle, the N-nary logic gate draws a constant amount of current from the power rail 302 through the inverter 316a or 316b and through N-tree 312. To discharge the output wire during the second portion of every clock cycle the N-nary logic gate sinks a consistent amount of current through the power rail 304 through the inverter 316 and from the power rail 302 through PMOS transistor 318a and 318b.

Constancy in current demand has an important result; power and ground supply voltage fluctuations are reduced. This is because the power and ground network has a certain inductance associated with it. A change in current demand through this inductance cause a voltage change in the power supplies.

A change in supply voltage can have several negative effects such as where a decrease in supply voltage causes gates to operate slower. Thus, operating frequency is negatively impacted by supply fluctuations. A variation in supply voltage between different parts of a device can reduce noise margin. Thus, robustness of a circuit may be impacted by supply variations.

The fluctuations in supply voltage due to changes in current consumption can be reduced by adding decoupling capacitance on-chip. However, such decoupling capacitors require additional area and also increase the likelihood that a manufacturing defect will occur.

The present invention, by reducing the variation in current consumption, reduces power supply voltage fluctuation, allowing higher operating frequencies, greater noise immunity and lower manufacturing cost and/or greater manufacturing yield due to a reduction in the amount of on-chip decoupling capacitance required.

In summary, the present invention comprises a method and apparatus for a logic circuit with constant power consumption. The logic circuit comprises a 1 of P first input signal that further comprises a plurality of wires wherein each wire of said plurality of wires has equal capacitive loading. The logic circuit additionally comprises a 1 of Q second input signal that comprises a plurality of wires wherein each wire of said plurality of wires has equal capacitive loading. A logic tree circuit couples to the first input signal and the second input signal. The logic tree circuit generates a result for a 1 of R output signal, which couples to the logic tree circuit. The 1 of R output signal comprises a plurality of wires wherein each wire of said plurality of wires has equal capacitive loading. The power consumption of the logic circuit is independent of the value of the first signal or the second signal, which results in the logic circuit having constant power consumption. Additionally, the logic circuit has a consistent current demand. The present invention provides that exactly one wire of the plurality of wires of the output signal is charged and discharged every clock cycle. The preferred embodiment of the present invention provides P, Q, and R each being equal to 4; i.e., the 1 of P signal, the 1 of Q signal, and the 1 of R signal are all 1 of 4 signals. Other embodiments of the present invention provide for P, Q, and R each being greater than 2.

Other embodiments of the invention will be apparent to those skilled in the art after considering this specification or practicing the disclosed invention. The specification and examples above are exemplary only, with the true scope of the invention being indicated by the following claims.

We claim the following invention:

1. A logic circuit with substantially constant power consumption, comprising:

a 1 of P first input signal that comprises a plurality of wires wherein each wire of said plurality of wires has substantially the same capacitive loading;

a 1 of Q second input signal that comprises a plurality of wires wherein each wire of said plurality of wires has substantially the same capacitive loading;

a logic tree circuit that couples to said first input signal and said second input signal; and a 1 of R output signal that couples to said logic tree circuit and that further comprises a plurality of wires wherein each wire of said plurality of wires has substantially the same capacitive loading;

wherein the power consumption of the logic circuit is independent of the value of said first signal or said second signal that results in the logic circuit having substantially constant power consumption.

2. The logic circuit of claim 1 wherein P, Q, and R each is greater than 2.

3. The logic circuit of claim 1 wherein P, Q, and R each equal 4.

4. The logic circuit of claim 1 wherein exactly one wire of said plurality of wires of said output signal is charged and discharged every clock cycle.

5. The logic circuit of claim 1 wherein the logic circuit has a substantially consistent current demand.

6. A system that uses a logic circuit with substantially constant power consumption, comprising:

a 1 of P first input signal that comprises a plurality of wires wherein each wire of said plurality of wires has substantially the same capacitive loading;

a 1 of Q second input signal that comprises a plurality of wires wherein each wire of said plurality of wires has substantially the same capacitive loading;

a logic tree circuit that couples to said first input signal and said second input signal; and a 1 of R output signal that couples to said logic tree circuit and that further comprises a plurality of wires wherein each wire of said plurality of wires has substantially the same capacitive loading;

wherein the power consumption of the logic circuit is independent of the value of said first signal or said second signal that results in the logic circuit having substantially constant power consumption.

7. The system of claim 6 wherein P, Q, and R each is greater than 2.

8. The system of claim 6 wherein P, Q, and R each equal 4.

9. The system of claim 6 wherein exactly one wire of said plurality of wires of said output signal is charged and discharged every clock cycle.

10. The system of claim 6 wherein the logic circuit has a substantially consistent current demand.

11. A method of making a logic circuit with substantially constant power consumption, comprising:

providing a 1 of P first input signal that comprises a plurality of wires wherein each wire of said plurality of wires has substantially the same capacitive loading;

providing a 1 of Q second input signal that comprises a plurality of wires wherein each wire of said plurality of wires has substantially the same capacitive loading;

coupling a logic tree circuit to said first input signal and said second input signal; and coupling a 1 of R output signal to said logic tree circuit, said 1 of R output signal further comprises a plurality of wires wherein each wire of said plurality of wires has substantially the same capacitive loading;

wherein the power consumption of the logic circuit is independent of the value of said first signal or said second signal that results in the logic circuit having substantially constant power consumption.

12. The method of claim 11 wherein P, Q, and R each is greater than 2.

13. The method of claim 11 wherein P, Q, and R each equal 4.

14. The method of claim 11 wherein exactly one wire of said plurality of wires of said output signal is charged and discharged every clock cycle.

15. The method of claim 11 wherein the logic circuit has a substantially consistent current demand.

16. A method that uses a logic circuit with substantially constant power consumption, comprising:

providing a 1 of P first input signal that comprises a plurality of wires wherein each wire of said plurality of wires has substantially the same capacitive loading;

providing a 1 of Q second input signal that comprises a plurality of wires wherein each wire of said plurality of wires has substantially the same capacitive loading; and generating a 1 of R output signal from a logic tree circuit, said logic tree circuit couples to said first input signal, said second input signal, and said output signal, said output signal further comprises a plurality of wires wherein each wire of said plurality of wires has substantially the same capacitive loading;

wherein the power consumption of the logic circuit is independent of the value of said first signal or said second signal that results in the logic circuit having substantially constant power consumption.

17. The method of claim 16 wherein P, Q, and R each is greater than 2.

18. The method of claim 16 wherein P, Q, and R each equal 4.

19. The method of claim 16 wherein exactly one wire of said plurality of wires of said output signal is charged and discharged every clock cycle.

20. The method of claim 16 wherein the logic circuit has a substantially consistent current demand.

* * * * *

UNITED STATES PATENT AND TRADEMARK OFFICE
CERTIFICATE OF CORRECTION

PATENT NO : 6,107,835
DATED : 08-22-2000
INVENTOR(S): Blomgren et al.

It is certified that error appears in the above-identified patent and that said Letters Patent are hereby corrected as shown below:

Column 11, line 13, delete the second word "internal".

Signed and Sealed this

First Day of May, 2001

Attest:

NICHOLAS P. GODICI

*Attesting Officer*   *Acting Director of the United States Patent and Trademark Office*